United States Patent [19]
Okazaki et al.

[11] Patent Number: 5,275,665
[45] Date of Patent: Jan. 4, 1994

[54] METHOD AND APPARATUS FOR CAUSING PLASMA REACTION UNDER ATMOSPHERIC PRESSURE

[75] Inventors: Satiko Okazaki, Tokyo; Masuhiro Kogoma, Saitama, both of Japan

[73] Assignee: Research Development Corporation of Japan, Tokyo, Japan

[21] Appl. No.: 774,143

[22] Filed: Oct. 15, 1991

Related U.S. Application Data

[60] Continuation of Ser. No. 522,979, May 14, 1990, abandoned, which is a division of Ser. No. 361,861, Jun. 6, 1989, abandoned.

[30] Foreign Application Priority Data

| Jun. 6, 1988 | [JP] | Japan | 64-138630 |
| Jul. 4, 1988 | [JP] | Japan | 64-166599 |
| Aug. 15, 1988 | [JP] | Japan | 64-202977 |

[51] Int. Cl.$^5$ ............................................. C23C 16/50
[52] U.S. Cl. ............................................. 118/723 E
[58] Field of Search ............................................. 118/723

[56] References Cited

U.S. PATENT DOCUMENTS

| 4,223,048 | 9/1980 | Engle | 118/723 |
| 4,379,943 | 4/1983 | Yang | 427/39 |
| 4,534,816 | 8/1985 | Chen | 156/345 |
| 4,616,597 | 10/1986 | Kaganowicz | 118/723 |
| 4,673,588 | 6/1987 | Bringman | 118/723 |
| 4,767,641 | 8/1988 | Kieser | 118/723 |
| 4,780,169 | 10/1988 | Stark | 156/345 |
| 4,844,945 | 7/1989 | Bhaskar | 427/39 |
| 5,022,979 | 6/1991 | Hijikata | 118/723 |
| 5,031,571 | 7/1991 | Igarashi | 118/723 |

FOREIGN PATENT DOCUMENTS

| 60-77427 | 5/1985 | Japan | 118/723 |
| 63-219129 | 8/1988 | Japan | 118/723 |

*Primary Examiner*—Richard Bueker
*Attorney, Agent, or Firm*—Wenderoth, Lind & Ponack

[57] ABSTRACT

The apparatus of the present invention comprises a reaction vessel, and disposed within this vessel, a pair of opposed electrodes. The opposed electrodes comprise an upper electrode and a lower electrode which are spaced apart a suitable distance for receiving the substrate. The lower electrode has an upper surface covered with a solid dielectric. The upper electrode may have its lower surface covered with a solid dielectric, or it may be composed of a plurality of fine wires. Near the spaced apart electrodes are a plurality of gas outlets for uniformly dispersing the reaction gas between the spaced apart electrodes.

The method of the present invention comprises introducing a reagent gas or a mixture of a reagent gas and a rare gas or an inert gas into the reaction vessel, exciting the gas to produce a glow discharge plasma under atmospheric pressure, and treating the surface of the substrate with the plasma.

10 Claims, 5 Drawing Sheets

METHOD AND APPARATUS FOR CAUSING PLASMA REACTION UNDER ATMOSPHERIC PRESSURE

This application is a continuation of now abandoned application, Ser. No. 07/522,979 filed on May 14, 1990, which was a divisional of Ser. No. 07/361,861 filed Jun. 6, 1989, also abandoned.

BACKGROUND OF THE INVENTION

FIELD OF THE INVENTION

The present invention relates to a method and apparatus for causing a plasma reaction under atmospheric pressure. More particularly, the present invention relates to a method and apparatus for forming a thin film on an article with a high efficiency, and a method and apparatus for reforming the surface of an article by means of highly stable glow discharge plasma under atmospheric pressure.

DESCRIPTION OF RELATED ART

Methods for forming a thin film and for reforming a surface based on low-pressure glow discharge plasma are widely known and industrially applied in various areas. One of the surface treatment methods using a low-pressure glow discharge plasma is the organic plasma reaction method for forming a thin film and/or for reforming the surface by means of the conversion of an organic compound gas into plasma.

There are available, for example, a method of generating a plasma from a hydrocarbon gas in a vacuum vessel and forming by precipitation an amorphous carbon film on a silicon substrate or a glass substrate, and a method for forming a polymer film by generating a plasma from an unsaturated hydrocarbon such as ethylene.

However, all of these conventional surface treatment methods are based on the use of a low-pressure in generating the glow discharge plasma, which consequently requires an apparatus and facilities for creating the low-pressure conditions. These reactions take place under a vacuum of about $1 \times 10^{-5}$ to $1 \times 10^{-3}$ torr in all cases, thus resulting in complicated operations, equipment maintenance and a high manufacturing cost. Furthermore, the low-pressure method has another disadvantage in that it is difficult to treat a large-area substrate.

With a view to overcoming these defects in the conventional methods, the present inventor carried out extensive studies and completed a new film forming method based on the generation of a glow discharge plasma under atmospheric pressure, thereby permitting a reduction of costs for the apparatus and facilities, and permitting an easy method for film formation on a large-area substrate. The background for this development included the inventor's research on ozone producing silent discharge for many years and an analysis of the reaction mechanism regarding plasma film formation.

The reaction caused by glow discharge under atmospheric pressure has been studied by the present inventor using a fluorine-containing gas, and the present invention was a perfection of his study into a film forming method and a surface reforming method.

Furthermore, the present invention provides a solution to the problem in generating a glow discharge plasma reaction under atmospheric pressure of producing an arc discharge when the substrate is a conductive metal or alloy.

More specifically, the present invention provides an improved reaction method based on glow-discharge plasma under atmospheric pressure which makes possible, even with a metal or alloy substrate, a highly stable plasma of a reaction gas having a high reaction activity under atmospheric pressure.

SUMMARY OF THE INVENTION

The apparatus of the present invention comprises a reaction vessel, and disposed within this vessel, a pair of opposed electrodes. The opposed electrodes comprise an upper electrode and a lower electrode which are spaced apart a suitable distance for receiving the substrate. The lower electrode has an upper surface covered with a solid dielectric. The upper electrode may have its lower surface covered with a solid dielectric, or it may be composed of a plurality of fine wires. Near the spaced apart electrodes are a plurality of ga outlets for uniformly dispersing the reaction gas between the spaced apart electrodes.

The method of the present invention comprises introducing a reagent gas or a mixture of a reagent gas and a rare gas or an inert gas into the reaction vessel, exciting the gas to produce a glow discharge plasma under atmospheric pressure, and treating the surface of the substrate with the plasma.

DETAILED DESCRIPTION OF THE INVENTION

According to the present invention, there is provided an atmospheric pressure reaction method for treating the surface of a substrate with a reactive plasma which comprises introducing a reagent gas or a mixture of a reagent gas and a rare gas or an inert gas into a reaction vessel having a pair of opposing electrodes, an upper electrode of which consists of a plurality of fine wires, or the surface of an upper electrode of which is covered with a solid dielectric, exciting the gas to produce glow discharge plasma under atmospheric pressure and treating the surface of said substrate with said plasma.

The film forming apparatus preferably has an upper electrode consisting of several fine wires, a solid dielectric on the upper surface of an lower electrode on which the substrate is placed and a perforated pipe which uniformly diffuses gas over the surface of the substrate and its vicinity. This embodiment is shown in FIG. 1.

Figure 1:
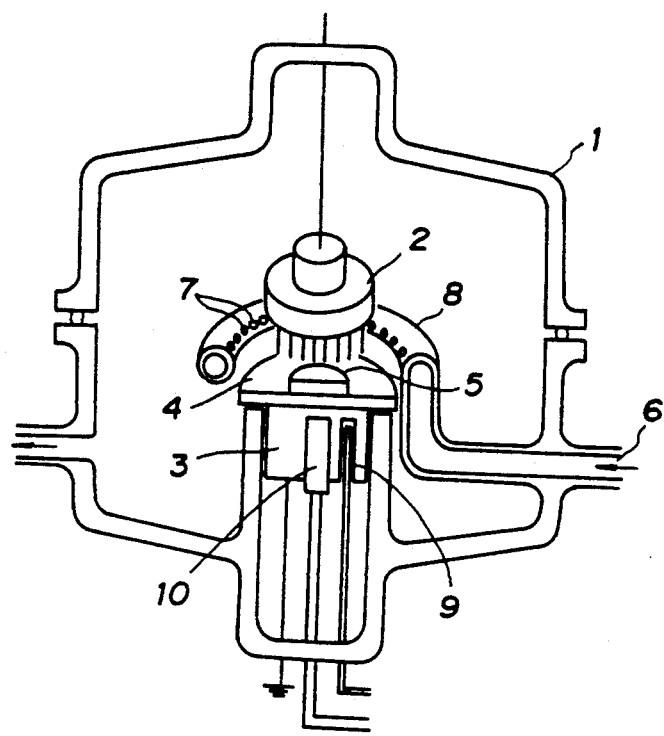
FIG. 1 is a perspective sectional view illustrating a film forming apparatus having an upper electrode comprising a plurality of fine wires, as an embodiment of the present invention.

More specifically, the apparatus shown in FIG. 1 has an upper electrode (2) and a lower electrode (3) which can apply a high voltage, in the reaction vessel consisting of a bell jar (1) made from Pyrex glass, for example. The upper electrode (2) consists of a plurality of fine wires. On the upper surface of the lower electrode (3), a solid dielectric (4) of such as glass, ceramics or plastics is provided. On this solid dielectric (4), a substrate (5) of plate body or the like is placed.

A mixture of inert gas such as He, Ne, Ar or $N_2$ and reagent gas such as hydrocarbon which is a raw material for forming a thin film is introduced through inlet (6) into a perforated pipe (8) having several openings (7) so that the mixture gas diffuses uniformly from openings (7) onto the substrate (5). Unreacted gas, inert gas, etc. are discharged from the gas outlet of the reaction vessel.

A temperature sensor (9) and a heater (10) are provided in the lower electrode (3). A cooling device can also be installed.

In the film forming apparatus of this invention which can be indicated as an example above, the reaction zone in the bell jar (i) is maintained under atmospheric pressure. Therefore, no vacuum device or equipment is required in contrast to a conventional low-pressure glow discharge plasma film formation apparatus.

For the inert gas to be used in the reaction, a suitable gas such as He, Ne, Ar or $N_2$ can be used alone or as a mixture. However, to prevent generating arc discharge, it is desirable to use He having the lowest electric potential to begin the glow discharge. It is possible to form a plasma polymer film by using the reagent gas mixed with the inert gas as the raw material for forming the film. The reagent gas may be selected from saturated hydrocarbons such as methane, ethane, etc., unsaturated hydrocarbons such as ethylene, propylene, etc., hydrocarbons having or not having a halogen or other functional group, semimetals such as Si, Ga, etc., or gaseous metal compounds.

Depending on the gas to be used, halogen, oxygen, hydrogen, nitrogen or ammonia may be mixed for the purpose of accelerating the reaction or as a reaction component for forming a $SiN_x$ film. The mixing ratio of the inert gas and the reagent gas is not specially limited, however, the desirable gas concentration is higher than 90%. A mixture of several kinds of gas may be used.

It is desirable to produce a plasma of the mixture gas at the state in which the gas is uniformly diffused and supplied in the plasma zone close to the substrate. To achieve this, the perforated pipe (8) shown in FIG. 1 or other suitable means may be used. Its shape and structure may be selected depending on the size of the apparatus and that of electrodes. In this case, an inflow of outside gas (oxygen, nitrogen, etc.) must be prevented.

Plasma is formed by applying a high voltage current to the electrodes. The voltage can be decided according to heat resistance, forming speed, or the like of the polymer film to be formed. The film formation speed can be controlled by adjusting the frequency and voltage. For example, as shown in FIG. 1, it is possible to make uniform the film thickness, minimize the difference in film thickness between the central part and peripheral part of the substrate (5) and form a stable glow discharge by using fine wires for the upper electrode (2) and providing a solid dielectric (4) on the lower electrode (3). In the case of FIG. 1, a film is also formed far more effectively by rotating the upper electrode (1).

Usually, a glow discharge is not produced easily under the atmospheric pressure, however, a highly stable glow discharge and plasma formation are possible by using an inert gas, the upper electrode consisting of several fine wires and the solid dielectric. For the substrate (5) it is possible to use a suitable material of ceramics, glass, plastics or the like.

Furthermore, this invention also offers a method and apparatus which can produce stably the atmospheric pressure glow discharge plasma reaction, without producing arc discharge, even though a conductive material such as a metal or alloy is used as a substrate.

This invention further offers the atmospheric pressure plasma reaction method, characterized by treating the surface of the substrate with a plasma produced at atmospheric pressure from the reagent gas introduced into the reaction vessel having a dielectric-covered electrode in which the surface of the upper electrode is covered with a solid dielectric, or two dielectric-covered electrodes in which the surface of each of the upper and lower electrodes is covered with a solid dielectric.

As a further preferred example, a perforated pipe is provided in the vicinity of the substrate so that the reaction gas diffuses uniformly. This apparatus is shown in FIG. 2.

Figure 2:
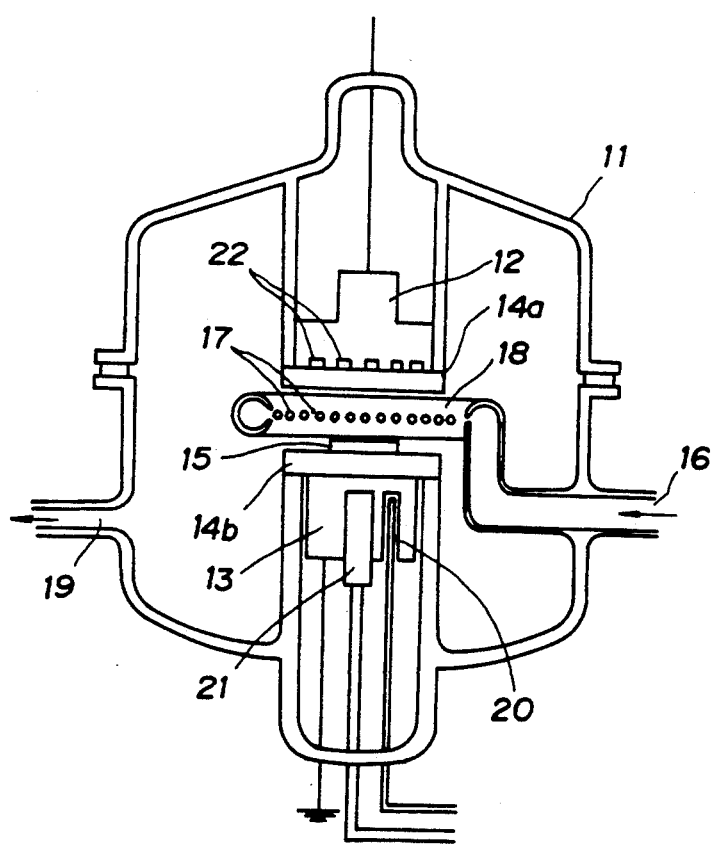
FIG. 2 is a sectional view illustrating a typical reaction apparatus of the present invention, in which a solid dielectric is arranged on each of the opposing upper and lower electrodes.

More specifically, the reaction apparatus of this invention shown in FIG. 2 has a solid dielectric provided on each of the upper and lower electrodes. The upper electrode (12) and the lower electrode (13), to which can be applied a high voltage, are disposed in the reaction vessel consisting of a bell jar (11) made from Pyrex glass.

On the surface of the upper electrode (12) and lower electrode (13), a heat resistant solid dielectric (14a) and (14b) made of glass, ceramics, plastics or mica is provided. On the solid dielectric (14b) provided on the upper surface of lower electrode (13), a substrate (15) such as a plate body is placed.

The reaction gas consisting of a mixture of rare gas such as He, Ne, Ar, etc., and reagent gas is introduced into a perforated pipe (18) having many openings (17) through the reaction gas inlet (16) so that the reaction gas diffuses from openings (17) uniformly onto the substrate (15). Unreacted gas, rare gas, etc. are discharged from the gas outlet (19) of the reaction vessel.

A temperature sensor (20) and a heater (21) are provided in the lower electrode (13). Installation of a cooling device is possible.

In this example, the reaction zone in the bell jar (11) is maintained under atmospheric pressure.

In general, a glow discharge is not produced easily at the atmospheric pressure and when the substrate (15) is a metal or alloy, an arc discharge occurs upon applying a high voltage and the surface treatment of the substrate (15) becomes difficult. In this invention, however, a stable glow discharge at atmospheric pressure is possible by providing the solid dielectrics (14a) and (14b) on the surface of the upper electrode (12) and lower electrode (13), respectively as shown in FIG. 2, even though the substrate (15) is a metal alloy or a conductive material such as silicon. Of course, if the substrate (15) is a ceramic, glass, glass plastic, or the like, a high stability glow discharge can be achieved.

For the reagent gas, it is possible to use an arbitrary material from among saturated or unsaturated hydrocarbons such as methane, ethane, ethylene, propylene, etc., or hydrocarbons having or not having a halogen such as $CF_4$, $C_2F_6$, $CHF_3$ or $SF_6$, or other functional group, or gaseous compounds of a semimetal such as Si and Ga or a metal. Furthermore, oxygen, halogen, hydrogen, nitrogen or ammonia may be added. The mixing ratio between the rare gas and reagent gas is not specially limited. However, the preferred rare gas concentration is higher than 65%, more preferably higher than 90%. For the reaction gas to be introduced, several kinds of gases may be used.

Depending on the types of the reagent gas and reaction conditions to be used, a plasma polymer film, a plasma reformed film and a plasma etched film can be obtained.

Figure 3:
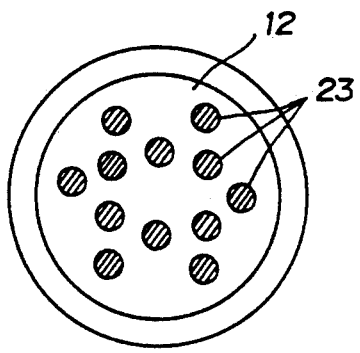
FIGS. 3 and 4 are bottom views illustrating a typical lower surface of the upper electrode of this reaction apparatus.
Figure 4:
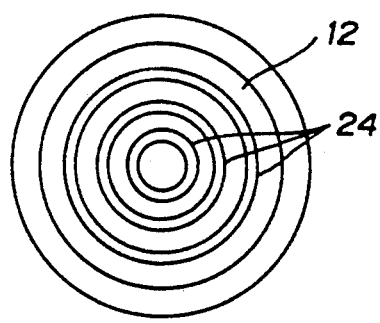

As shown in FIG. 2, it is effective to form several recesses or depressions (22) on the lower surface of upper electrode (12). These recesses (22) are effective in diffusing the glow discharge which is liable to concentrate on the edge and its vicinity of the upper electrode (12) uniformly over all the surface of the upper electrode (12). By virtue of these recesses (22), a localized concentration of glow discharge is prevented. Thus, a uniform film thickness is formed or uniform surface treatment is achieved on the surface of the substrate (15). The depth of these recesses (22) may be 1 to 2 mm. Furthermore, it is possible to decide the shape of these recesses (22) depending on the shape and property of the substrate (15). For example, the grooves (22) may be several closed-end circular holes (23) as shown in FIG. 3 or several concentric circular grooves (24) as shown in FIG. 4.

Figure 5:
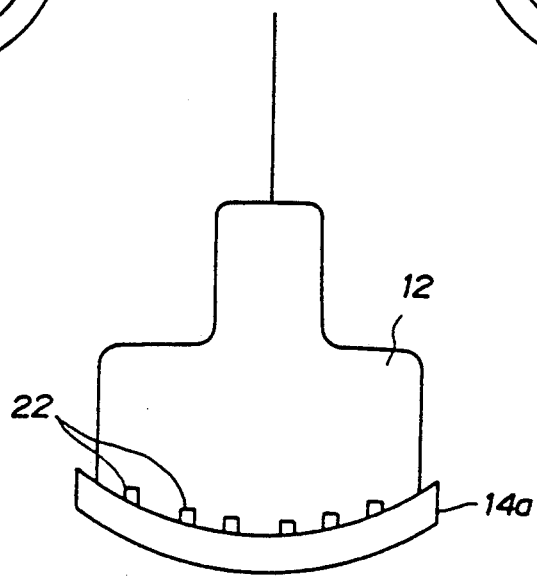
FIG. 5 is a partially cutaway sectional view illustrating another embodiment of the upper electrode of this reaction apparatus.

The shape of an upper electrode (12) may be changed, as shown in FIG. 5 to a convex surface. By this change, it is possible to raise the uniformity of surface treatment.

Under atmospheric pressure, the production of glow discharge has previously been difficult. However, a high stable glow discharge and formation of plasma has become possible by using a rare gas, providing a solid dielectric on each of the electrodes and forming several recesses on the lower surface of the upper electrode. As a substrate (15) shown in FIG. 2 a suitable material of metal, alloy, ceramics, glass, plastics, or the like can be used.

Figure 7:
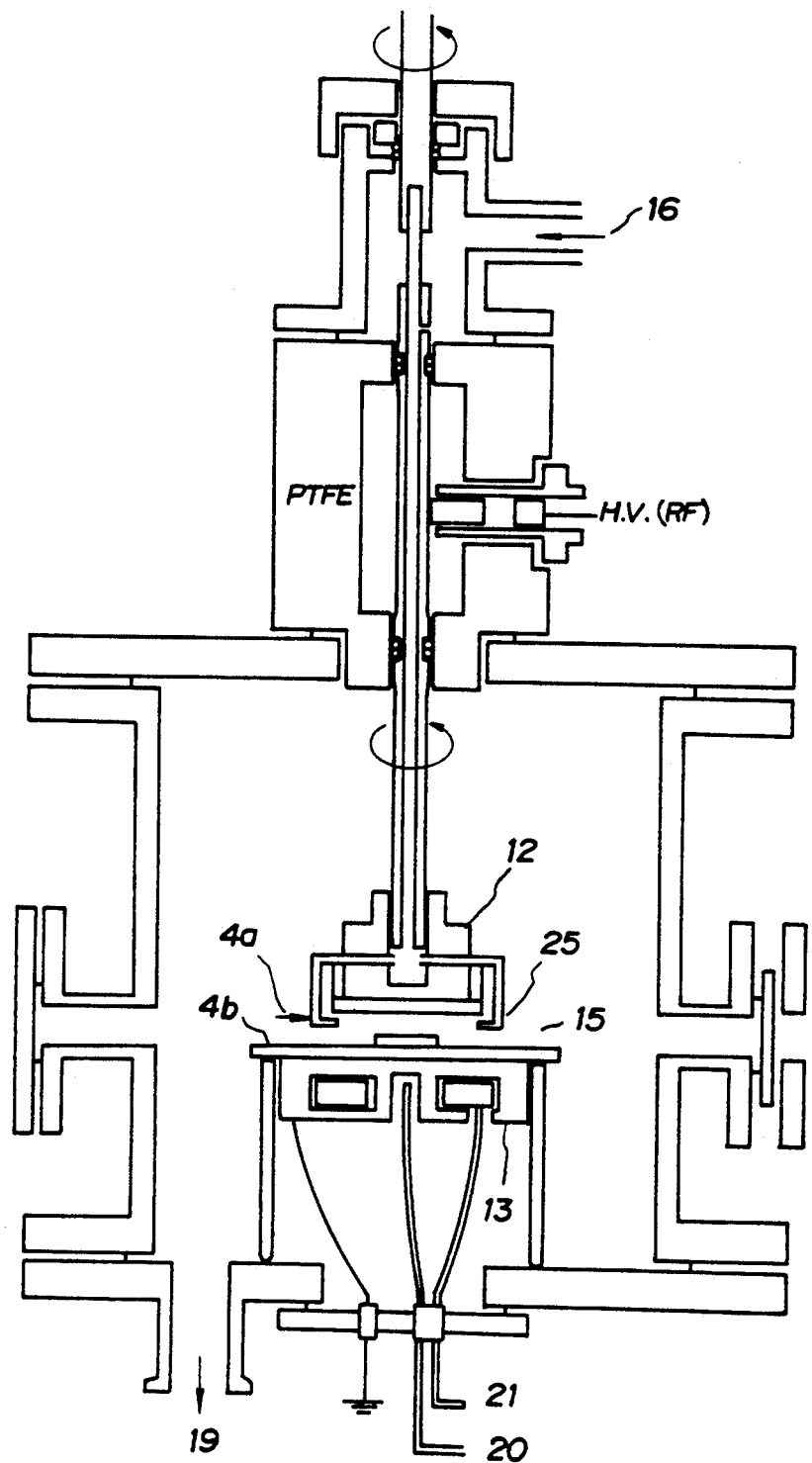
FIG. 7 is a sectional view illustrating further another embodiment of the reaction apparatus in which a solid dielectric is arranged on each of the opposing upper and lower electrodes.

FIG. 7 shows an example of the reaction apparatus having a different structure from that shown in FIG. 2. The upper electrode (12) rotates and reagent gas is introduced into the reaction zone through gas nozzle (25).

Figure 10:
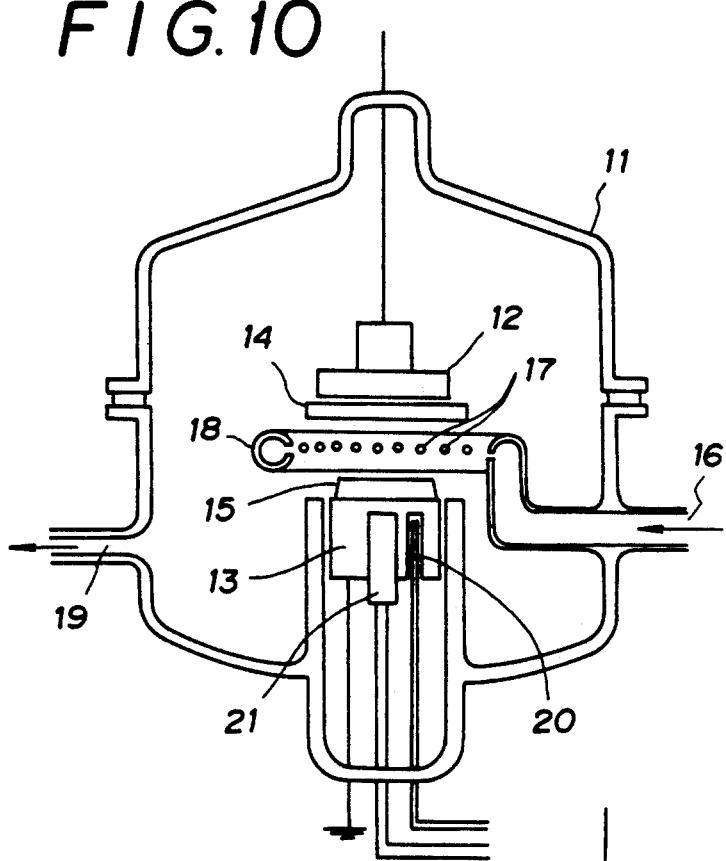
FIGS. 10 and 11 are sectional views illustrating further another embodiment of the reaction apparatus of the present invention, in which a solid dielectric is arranged on the upper electrode.

FIG. 10 shows an example in which the solid dielectric is provided only for the upper electrode. In other words, a heat resistant solid dielectric such as glass, ceramics, plastics or mica is provided on the surface of the upper electrode (12). On the upper surface of the lower electrode (13), the substrate (15) such as plate body is placed.

Figure 11:
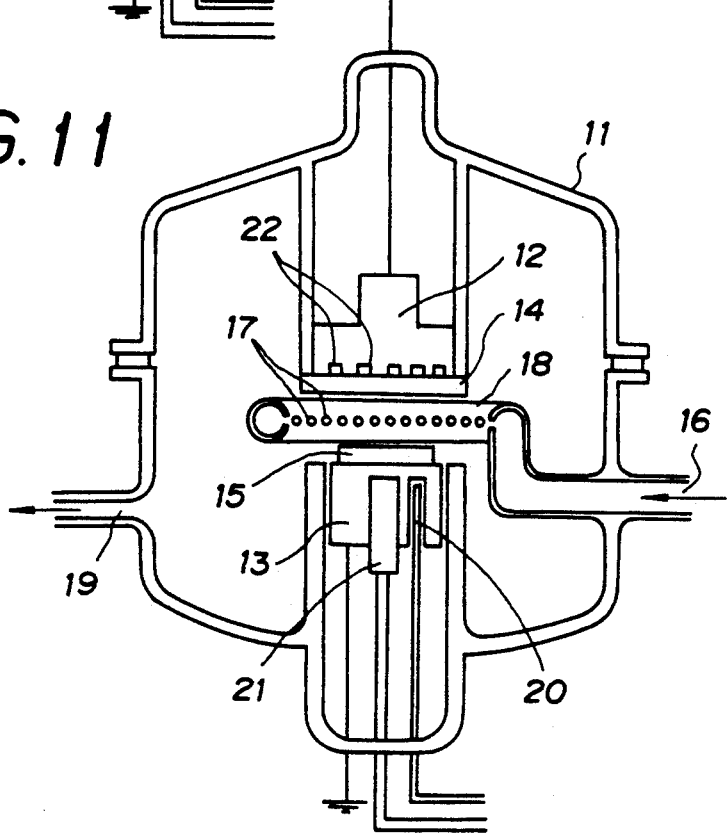

To obtain a more stable plasma under atmospheric pressure, it is effective to form several recesses (22) on the lower surface of the upper electrode (12) as shown in FIG. 11.

The recesses (22) uniformly diffuse the glow discharge which is liable to concentrate on the edge and its vicinity of the upper electrode (12), as in the apparatus shown in FIG. 2, and cause the glow discharge to diffuse over all parts of the surface of the upper electrode (12). By use of these recesses (22), it is possible to prevent a localized concentration of the glow discharge, to produce a uniformly diffused stable glow discharge, to form a uniform film thickness over the substrate (15) and to achieve a uniform surface treatment.

Now, the present invention will be described in further detail by means of the following examples.

EXAMPLE 1

With the use of the apparatus shown in FIG. (electrode diameter: 30 mm, distance between electrodes: 10 mm), a polyethylene film was formed from ethylene monomer under the following conditions:

(a) Gas mixture:
He: 4,500 SCCM,
Ethylene: 3.6 SCCM
(b) Glow discharge:
Atmospheric pressure,
3,000 Hz, 1.05 kV, 3 mA,
(c) Substrate:
Cover glass A polyethylene film was obtained on the substrate surface at a film forming rate of 12,500 Å/2 hr. The film was transparent, with a satisfactory adhesion.

EXAMPLE 2

A polymer film of ethylene was formed in the same manner as in the Example 1 under the following conditions:

(a) Gas mixture:
He:4,500 SCCM
Ethylene: 6.0 SCCM
(b) Glow discharge:
Atmospheric pressure,
3,000 Hz, 1.25 kV, 6 mA,
(c) Substrate:
Cover glass.

A polyethylene film was obtained at a film forming rate of 2,100 Å/2 hr. The film was transparent, with a satisfactory adhesion.

EXAMPLE 3

A polymer film of ethylene was formed in the same manner as in the Example 1 under the following conditions:

(a) Gas mixture:
He:4,500 SCCM
Ethylene:2.5 SCCM
(b) Glow discharge:
Atmospheric pressure,
3,000 Hz, 1.01 kV, 2.2 mA,
(c) Substrate:
Cover glass.

A polyethylene film was obtained at a film forming rate of 16,800 Å/5.5 hr. The film was transparent, with a satisfactory adhesion.

EXAMPLE 4

A polymer film of ethylene was formed in the same manner as in the Example 1 under the following conditions:

(a) Gas mixture:
He:4,500 SCCM,
Ethylene:3.6 SCCM (b) Glow discharge,
Atmospheric pressure,
3,000 Hz, 1.1 kV, 3 mA, (c) Substrate:
0.2 mm-thick quartz glass A polyethylene film was obtained at a film forming rate of 9,000 A/2 hr. The film was transparent, with a satisfactory adhesion.

In the apparatus as shown in FIG. 2 using heat-resistant captone-covered electrodes having a diameter of 30 mm and distance between electrodes of 10 mm (with no recesses (22)), a polyethylene film was formed from ethylene monomer under the following conditions:

(a) Reaction gas concentration (%):
Ethylene/He=95/5, (b) Discharge:
Atmospheric pressure,
3,000 Hz, 1.05 kV, 3 mA, (c) Substrate:
Aluminum substrate.

A polyethylene film was thus formed on the surface of the aluminum substrate at a film forming rate of 11,417 A/2 hr. The film was transparent, with an excellent adhesion and a uniform film thickness.

In this Example, a highly stable glow discharge took place without the occurrence of arc discharge, thus making available a high-activity and high-stability plasma.

EXAMPLE 6

In the same manner as in the Example 5, a polyethylene terephtalate film was treated under the following conditions, to make the surface thereof hydrophobic. Formation of a carbon-fluorine reformed film was confirmed.

(a) Reaction gas concentration (%):
$CF_4$/He=91.6/8.4,
$CF_4$:20 ml/min,
He:216.7 ml/min, (b) Discharge
Atmospheric pressure,
3,000 Hz, 3.46 to 3.75 kV, 8 mA, The relationship between the treatment time and the contact angle is shown in Table 1. For comparison purposes, the contact angle for an untreated case is also shown in Table 1.

The surface having become hydrophobic was confirmed, with a uniform state of treatment.

TABLE 1

| Treating time | 30 sec | 1 min | 5 min | Untreated |
|---|---|---|---|---|
| Contact angle | 95.5° | 96.0° | 98.0° | 64° |

EXAMPLE 7 AND 8

The same treatment as in the Example 6 was applied with a conductive graphite (already wrapped) as the substrate, under the conditions as shown in Table 2.

The measurement of the contact angle in these Examples permitted confirmation of a high degree of hydrophobic property. The result is shown in Table 2.

In an apparatus comprising electrodes not using solid dielectric, production of arc discharge made it impossible to carry out treatment.

TABLE 2

| | Example | | |
|---|---|---|---|
| Item | Example 7 | Example 8 | Case for comparison |
| Reaction Gas flow rate | | | |
| $CF_4$ | 93.6 ml/min | 93.6 ml/min | — |
| He | 216.7 ml/min | 216.7 ml/min | — |
| Discharge (atomspheric pressure) | | | |
| Current | 10 mA | 3 mA | — |
| Voltage | 3.99 kV | 2.74 kV | — |
| Treating | 5 min | 20 min | — |
| Contact angle | 128° | 137° | 68° |

EXAMPLE 9 AND 10

With the use of the reaction apparatus shown in FIG. 2, with recesses (22) in a case and without recesses (22) in another case, a plasma-polymerized polyethylene film was formed on a silicon substrate.

(a) Reaction gas:
$C_2H_5$:3.6 lm /min,
He:4,495 lm /min, (b) Discharge:
3,000 Hz, 1.5 hr,
Atmospheric pressure, room temperature.

Figure 6:
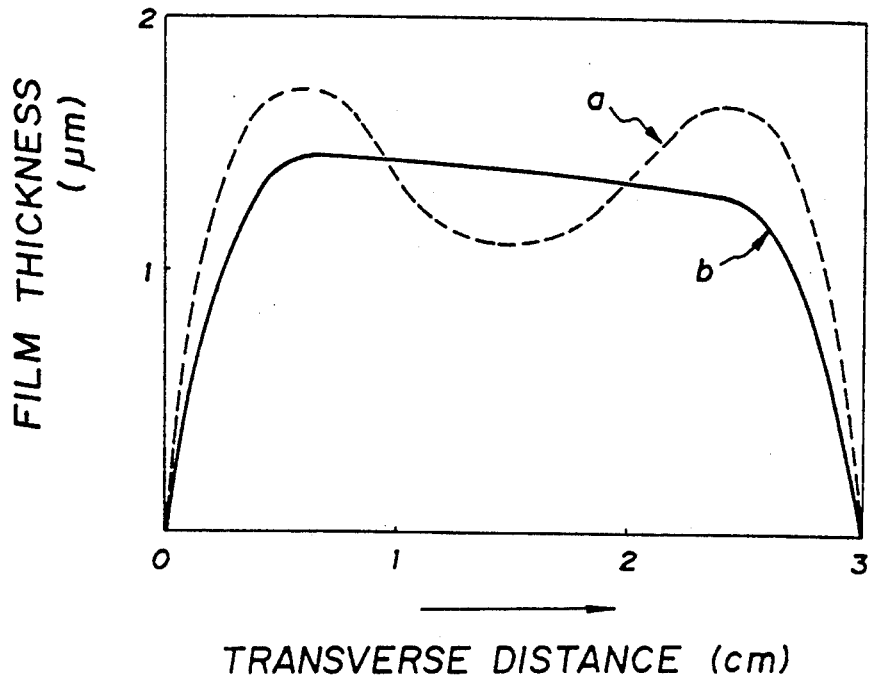
FIG. 6 is a chart illustrating the relationship between the transverse distance of the substrate and thickness of a thin film formed when a solid dielectric is arranged on each of the upper and lower electrodes.

The relationship between the transverse distance of the silicon substrate and the thickness of the plasma-polymerized polyethylene film is shown in FIG. 6.

As is clear from FIG. 6, as compared with the case (a) of the reaction apparatus without recesses (22), that (b) using an upper electrode with a concentric circular grooves (24) as shown in FIG. 4 permits achievement of a more uniform film thickness distribution, suggesting that the plasma is stabilized for the entire surface of the substrate.

EXAMPLE 11

A $SiN_x$ film was formed with the use of the apparatus shown in FIG. 7 under the following conditions for reaction:
He:5,000 ml/min,
$H_2$: 20 ml/min,
$N_2$: 20 ml/min,
$SiCl_4$: 4.5 mg/min,
Pressure: Atmospheric pressure,
RF:13.56 MHz, 220 W,
Temperature: 440° C.,
Substrate: Si Wafer.

Figure 8:
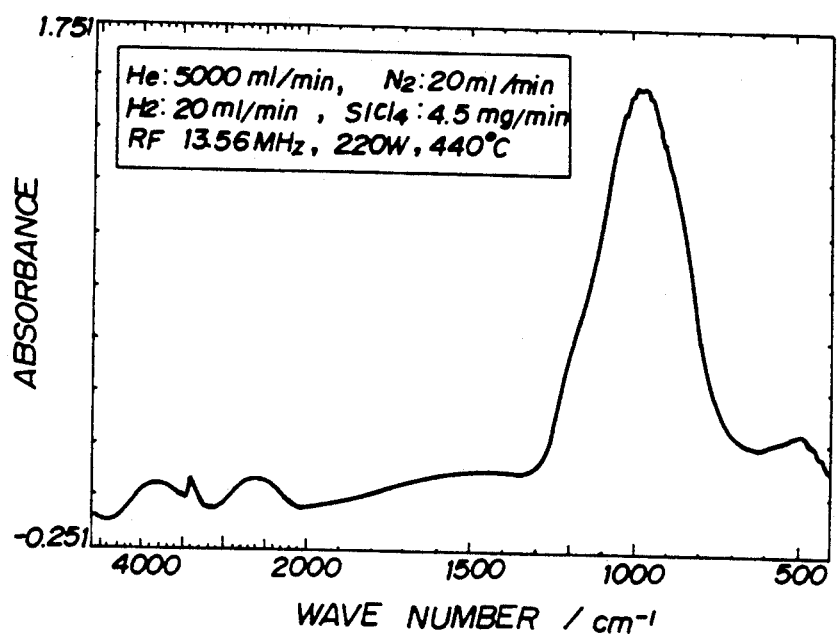
FIGS. 8 and 9 are views illustrating an IR absorption spectral chart and an XPS depth profile, respectively, when forming an $SiN_x$ film with the use of this apparatus.

FIG. 8 illustrates the difference in IR of the $SiN_x$ film thus obtained from the silicon substrate.

As Si-N expansion-contraction movement is observed near 850 $cm^{-1}$ and an Si-O expansion-contraction movement, at 1020-1090 $cm^{-1}$.

Figure 9:
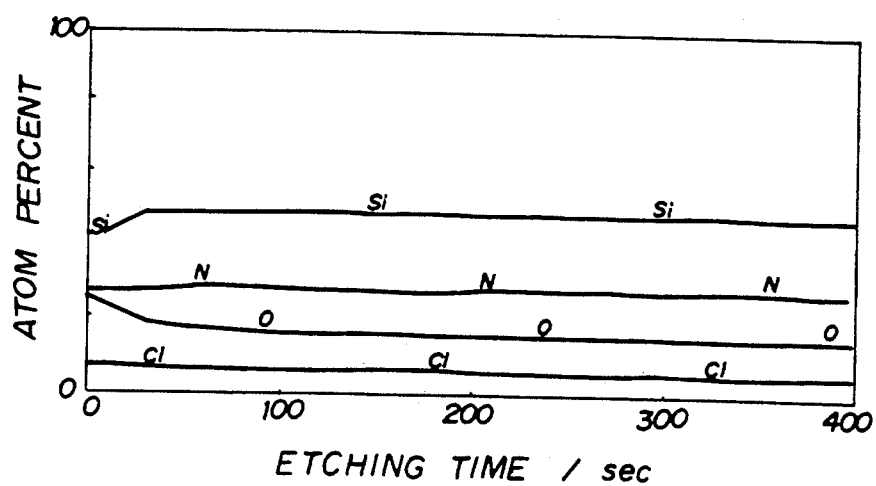

FIG. 9 shows the result of XPS analysis in the depth direction of the $SiN_x$ film, which permits confirmation of nitrogen contained in a large quantity. The film has $SiN_xO_y$ composition, and the content of oxygen thereof is controllable.

EXAMPLE 12

With the use of the apparatus shown in FIG. 10 using heat-resistant captone-covered electrodes having a diameter of 30 mm and a distance between electrodes of 10 mm, a polyethylene film was formed from ethylene monomer under the following conditions:

(a) Reaction gas flow rate:
$C_2H_4$: 3.0 SCCM,
He: 4,500 SCCM, (b) Discharge:
Atmospheric pressure, room temperature,
3,000 Hz, 1.0 kV,
1 to 5 mA (gradually increased), (c) Substrate:
Silicon substrate.

A polyethylene film was formed on the silicon substrate at a film forming rate of 10,000 to 20,000 A/hr. The film was transparent, with a satisfactory adhesion and a uniform film thickness.

In this example, a highly stable and uniformly dispersed glow discharge took place without the occurrence of arc discharge, thus making available a high-activity and high-stability plasma.

EXAMPLE 13

In the same manner as in the Example 12, a polyethylene terephthalate film was formed under the following conditions to make the surface thereof hydrophobic:

(a) Reaction gas flow rate:
$CF_4$: 25 SCCM,
He: 210 SCCM, (b) Discharge:
Atmospheric pressure,
3,000 Hz, 3.5 kV,
2 to 8 mA (gradually increased).

The contact angle was measured five minutes after the start of treatment. The result showed a contact angle of 98.0°. A non-treatment film had a contact angle of 64°. The surface having become hydrophobic was confirmed. Treatment was uniform.

EXAMPLE 14

The same treatment as in the Example 13 was applied with a conductive graphite (already wrapped) as the substrate.

(a) Reaction gas flow rate:
$CF_4$: 96 SCCM,
He: 220 SCCM, (b) Discharge:
Atmospheric pressure,
3,000 Hz, 2.8 kV,
3 to 5 mA (gradually increased).

The contact angle was measured 15 minutes after the start of treatment. The result showed a contact angle of 131°. A non-treated film had a contact angle of 68°. The surface having become hydrophobic was confirmed. Treatment was uniform. In this Example, a highly stable and uniformly dispersed glow discharge took place without the occurrence of arc discharge as in the Example 12, thus making available a high-activity and high-stability plasma.

The present invention is not limited to the above-mentioned examples. It is needless to mention that various manners are possible within the framework of the present invention in such details as the size and shape of the reaction vessel, the structure, configuration and shape of the electrodes, the shape and number of recesses on the lower surface of the upper electrode, and the structure and configuration of the reaction gas supply.

According to the present invention, as described above in detail, it is possible, as compared with the conventional low-pressure glow discharge plasma reaction, to eliminate the necessity of an apparatus and facilities for forming a vacuum system, reduce the cost, and carry out film formation and/or surface treatment under the atmospheric pressures, requiring only a simple structure and configuration of the apparatus and permitting easy treatment of a large-area substrate because the substrate can be set directly on the upper surface of the lower electrode.

Furthermore, the present invention allows for film formation and/or surface treatment without limiting the material, shape and properties of the substrate and makes available a uniform film thickness and surface condition o the thin film obtained.

What is claimed is:

1. An atmospheric pressure glow discharge plasma reaction apparatus, which comprises a reaction vessel, and disposed within said reaction vessel, a pair of opposed electrodes, said opposed electrodes spaced apart for receiving a substrate and comprising an upper electrode and a lower electrode, said lower electrode having an upper surface covered with a solid dielectric, and a gas supply means disposed proximate to said opposed electrodes and having at least one opening for uniformly dispersing a reaction gas between said spaced apart electrodes near the surface of the substrate, wherein said apparatus is adapted for generating a stable glow discharge plasma reaction at atmospheric pressure and thus has no vacuum generating means for generating a vacuum therein and no vacuum connection means for connecting the apparatus to a separate vacuum-generating means.

2. The apparatus according to claim 1, wherein the upper electrode consists of a plurality of fine wires.

3. The apparatus according to claim 1, wherein the lower surface of the upper electrode is covered with a solid dielectric.

4. The apparatus according to claim 1, wherein the gas supply means is a perforated pipe having a plurality of openings.

5. The apparatus according to claim 1, wherein the gas supply means is a rotatable gas nozzle.

6. The apparatus according to claim 1, wherein the wherein the lower surface of the upper electrode is convex.

7. The apparatus according to claim 1, wherein the the upper electrode is rotatable.

8. The apparatus according to claim 1, wherein the lower surface of the upper electrode contains recesses for diffusing an arc discharge.

9. The apparatus according to claim 8, wherein the recesses are concentric circular grooves.

10. The apparatus according to claim 8, wherein the recesses are a plurality of closed-end holes.

* * * * *